(12) United States Patent
Hoang

(10) Patent No.: US 6,617,925 B2
(45) Date of Patent: Sep. 9, 2003

(54) METHOD AND APPARATUS FOR GAIN COMPENSATION AND CONTROL IN LOW VOLTAGE DIFFERENTIAL SIGNALING APPLICATIONS

(75) Inventor: Chinh L. Hoang, San Diego, CA (US)

(73) Assignee: Nurlogic Design, Inc., San Diego, CA (US)

( * ) Notice: Subject to any disclaimer, the term of this patent is extended or adjusted under 35 U.S.C. 154(b) by 0 days.

(21) Appl. No.: 10/172,206

(22) Filed: Jun. 13, 2002

(65) Prior Publication Data

US 2002/0190795 A1 Dec. 19, 2002

Related U.S. Application Data

(60) Provisional application No. 60/298,560, filed on Jun. 14, 2001.

(51) Int. Cl.$^7$ ................................................. H03F 3/45
(52) U.S. Cl. ....................................... 330/258; 330/253
(58) Field of Search ................................. 330/253, 258

(56) References Cited

U.S. PATENT DOCUMENTS

| 5,684,429 | A |  | 11/1997 | Sanwo et al. | ............... | 327/563 |
|---|---|---|---|---|---|---|
| 5,939,904 | A | * | 8/1999 | Fetterman et al. | .......... | 330/258 |
| 5,977,796 | A |  | 11/1999 | Gabara | ......................... | 326/86 |
| 6,028,467 | A |  | 2/2000 | Burrows et al. | ............ | 327/331 |
| 6,194,949 | B1 |  | 2/2001 | Hogeboom | ................. | 327/391 |
| 6,201,405 | B1 |  | 3/2001 | Hedberg | ...................... | 326/30 |

FOREIGN PATENT DOCUMENTS

| DE | 199 22 354 | 5/2000 |
|---|---|---|
| EP | 0 788 059 | 8/1997 |
| JP | 2000031810 | 1/2000 |
| JP | 2000134082 | 5/2000 |

\* cited by examiner

Primary Examiner—Patricia Nguyen
(74) Attorney, Agent, or Firm—Pillsbury Winthrop LLP

(57) ABSTRACT

A low voltage differential signaling receiver includes a gain compensation and control circuit having a low common mode compensation circuit and a high common mode compensation circuit. A control circuit is coupled to both compensation circuits and senses the operation of one to control the operation of the other. The operation of the compensation circuits ensures that differential signals having a wide range of common mode input voltages are accurately detected by the receiver. The control circuit serves to keep the combined operation of the compensation circuits stable over the wide range of common mode input voltages.

19 Claims, 4 Drawing Sheets

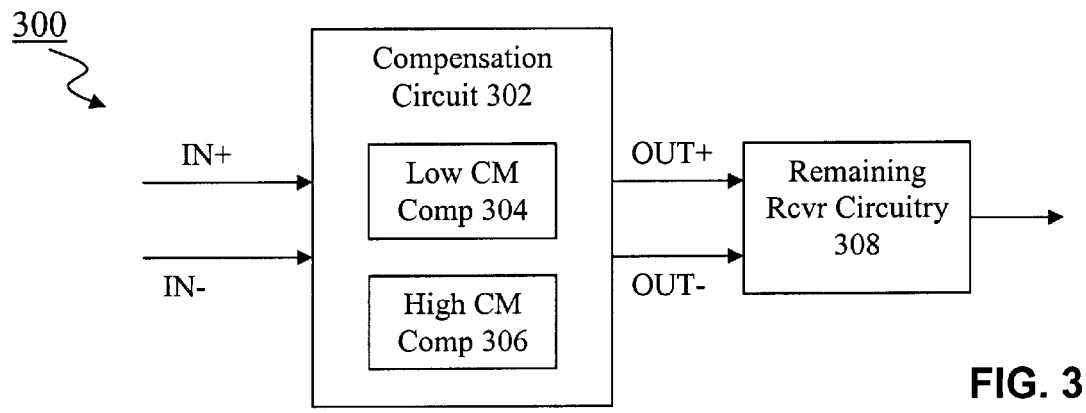
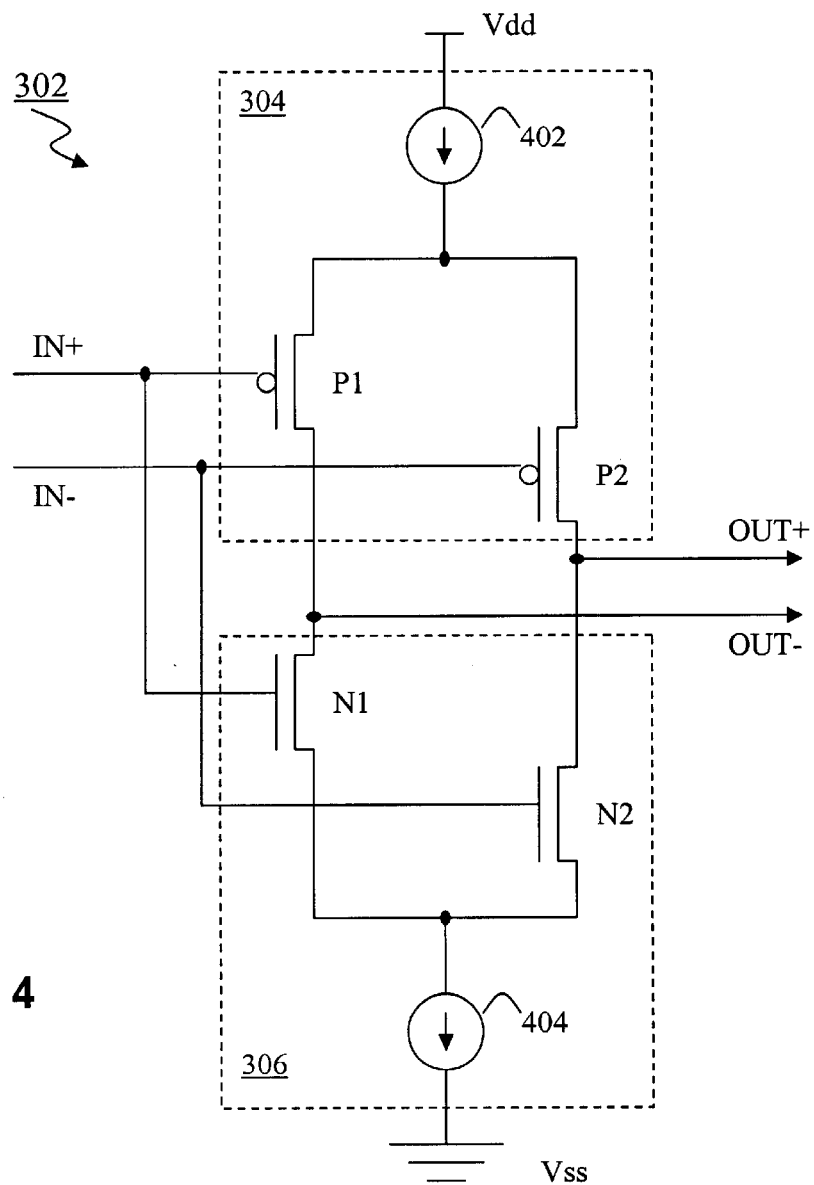
FIG. 3
FIG. 4

METHOD AND APPARATUS FOR GAIN COMPENSATION AND CONTROL IN LOW VOLTAGE DIFFERENTIAL SIGNALING APPLICATIONS

CROSS-REFERENCE TO RELATED APPLICATIONS

The present application is based on, and claims priority from, U.S. Appln. No. 60/298,560, filed Jun. 14, 2001, commonly owned by the assignee of the present application, the contents of which are incorporated herein by reference.

FIELD OF THE INVENTION

The present invention relates generally to data signaling devices, and more particularly, to low voltage differential signaling devices and methods that include gain compensation and bias control for stable operation over a wide range of common mode input voltages.

BACKGROUND OF THE INVENTION

Low voltage differential signaling (LVDS) applications have become common, particularly with the popularity of CMOS technology. Certain industry standards for LVDS are specified by ANSI/TIA/EIA-644 and IEEE 1596.4.

An example LVDS application is shown in FIG. 1. As shown in FIG. 1, two circuits 102 and 104 (on the same circuit board or integrated chip, or on separate such components) communicate with each other over a pair of conductors 110 using LVDS signaling. In such an example, an LVDS driver 106 sends a differential signal to be received by LVDS receiver 108 by driving opposite polarity (i.e. complementary) signals on each conductor, both polarity signals having the same common-mode voltage. LVDS requires the combined differential voltage on conductors 110 to be no more than 600 mV. Although the common-mode voltage may vary due to noise and temperature conditions, for example, preferably the common-mode voltage is about 1.2V. However, LVDS requires receivers to be able to understand signals that range between 0V and 2.4V.

As illustrated in FIG. 2, signals 202 and 204 that are received by an LVDS receiver may technically be in compliance with LVDS. (It should be understood that the signal on only one conductor is shown and that there will actually be a pair of complementary signals having opposite polarity on the conductors at the same common mode voltage). Signal 202 has a high common mode voltage Vcm(high) such that it ranges at or just below the upper LVDS range of 2.4V, while signal 204 has a low common mode voltage Vcm(low) such that it ranges at or just above the lower LVDS range of 0V. Although both signals 202, 204 are in technical compliance with LVDS standards, they pose problems for conventional LVDS receivers. For example, if receiver 108 is biased for signals having a common-mode voltage of 1.2V, it may operate poorly or not at all when the signals are close to the extreme low and high values of 0V and 2.4V, thereby preventing data signals between circuits 102 and 104 from being properly communicated.

SUMMARY OF THE INVENTION

The present invention relates to differential data signaling devices and methods. In accordance with one aspect of the invention, a differential signaling receiver includes a gain compensation and control circuit having a low common mode compensation circuit and a high common mode compensation circuit. A control circuit is coupled to both compensation circuits and senses the operation of one to control the operation of the other. The operation of the compensation circuits ensures that differential signals having a wide range of common mode input voltages are accurately detected by the receiver. The control circuit serves to keep the combined operation of the compensation circuits stable over the wide range of common mode input voltages.

BRIEF DESCRIPTION OF THE DRAWINGS

These and other aspects and features of the present invention will become apparent to those ordinarily skilled in the art upon review of the following description of specific embodiments of the invention in conjunction with the accompanying figures, wherein:

FIG. 3 is a block diagram illustrating concepts of an example receiver in accordance with the principles of the invention;

FIG. 4 is a circuit diagram illustrating concepts of an example implementation of a compensation and control circuit that can be included in a receiver such as that illustrated in FIG. 3;

DETAILED DESCRIPTION OF THE PREFERRED EMBODIMENTS

Figure 1:
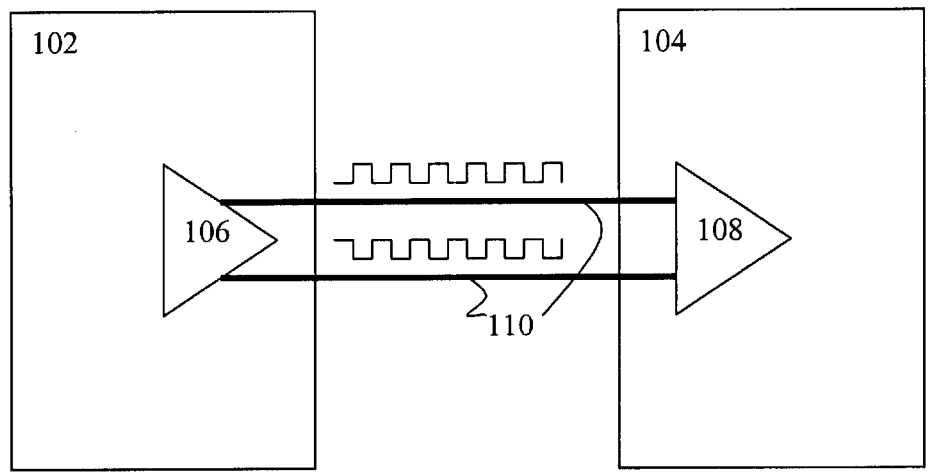
FIG. 1 is a block diagram illustrating an example LVDS application.
Figure 2:
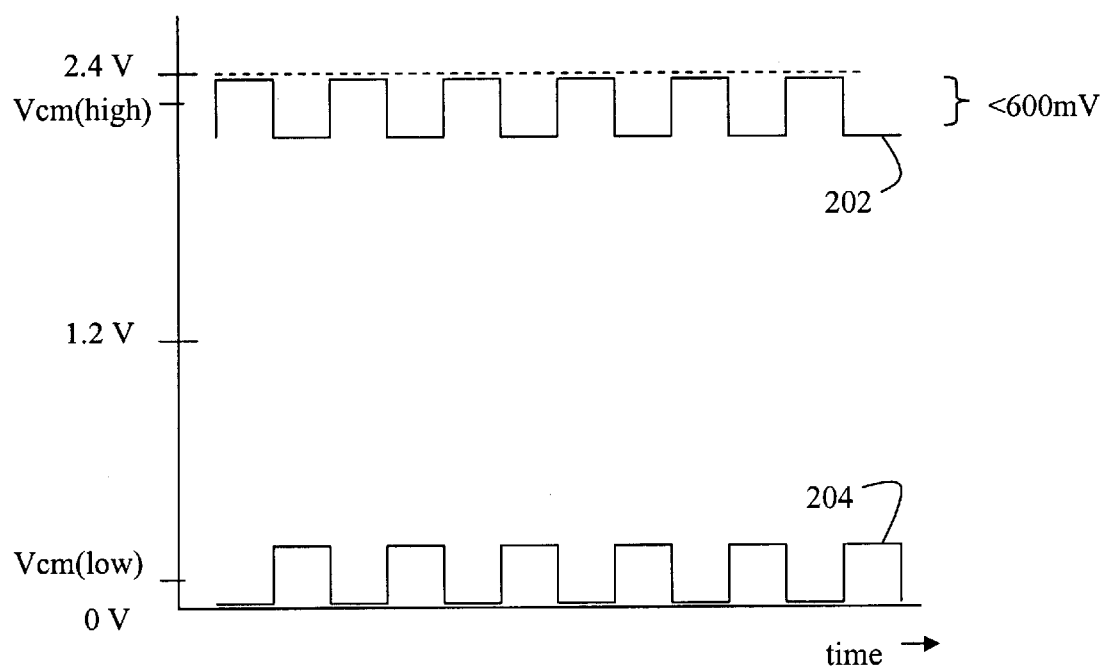
FIG. 2 further illustrates possible signal values in an LVDS application.

The present invention will now be described in detail with reference to the drawings, which are provided as illustrative examples of the invention so as to enable those skilled in the art to practice the invention. Notably, the figures and examples below are not meant to limit the scope of the present invention. Moreover, where certain elements of the present invention can be partially or fully implemented using known components, only those portions of such known components that are necessary for an understanding of the present invention will be described, and detailed descriptions of other portions of such known components will be omitted so as not to obscure the invention. Further, the present invention encompasses present and future known equivalents to the known components referred to herein by way of illustration.

FIG. 3 is a block diagram illustrating principles of the present invention. As shown in FIG. 3, an example receiver 300 according to the present invention includes a compensation circuit 302. Compensation circuit 302 includes a low common-mode (CM) compensation circuit 304 and a high common-mode (CM) compensation circuit 306. Generally, circuit 304 compensates for a condition where the common-mode input voltage (established on lines IN+ and IN−) is below the preferred voltage of about 1.2V and circuit 306 compensates for a condition where the common-mode voltage is above the preferred voltage of about 1.2V. The combined operations of circuits 304 and 306 provide a differential output (on lines OUT+ and OUT−) having a normalized common mode voltage to the remaining receiver circuit 308. Remaining receiver circuitry 308 may then further translate the differential signal to a single ended logic signal to be used by internal circuitry associated with receiver 300. Such receiver circuitry is well understood by those skilled in the art and a detailed description thereof is unnecessary for an understanding of the present invention.

FIG. 4 is a circuit diagram illustrating certain concepts of an example of compensation circuit 302. As shown in FIG. 4, low common mode compensation circuit 304 in this example includes a pair of PFETs P1 and P2 commonly coupled to a bias current supply 402. Differential input signals received at nodes IN+ and IN− are coupled to the gates of P1 and P2, respectively. As is notoriously well known, current conducts between the two source/drain terminals of a FET in accordance with the voltage level applied at the gate terminal. While one of the source/drains of PFETs P1 and P2 are commonly coupled to bias current supply 402, the other of their source/drains are coupled to output signal nodes OUT− and OUT+, respectively. Bias current supply 402 is further coupled to a high supply voltage Vdd (e.g. 3.3V).

As further shown in FIG. 4, high common mode compensation circuit 304 in this example includes a pair of NFETs N1 and N2 commonly coupled to a bias current supply 404. Differential input signals IN+ and IN− are coupled to the gates of N1 and N2, respectively. While one of the source/drains of NFETs N1 and N2 are commonly coupled to bias currrent supply 404, the other of their source/drains are coupled to output signal nodes OUT− and OUT+, respectively. Bias current supply 404 is further coupled to a low supply voltage Vss (e.g. ground).

In operation, when a differential signal having a low common-mode voltage (e.g. lower than 1.2V) is received, PFETs P1 and P2 will dominate operation. Accordingly, when a low common-mode differential signal wherein IN+is greater than IN− is received (i.e. a differential signal having a first logic state or a "high" logic signal), P2 will conduct more than P1, causing more bias current to be drawn by P2 than P1, thus causing the voltage at node OUT+ to be pulled closer to the high supply voltage Vdd than the voltage at node OUT−, and insuring that the differential signal is detected by the remaining receiver circuitry despite the low common-mode voltage. Conversely, when a low common-mode differential signal wherein IN− is greater than IN+ is received (i.e. a differential signal having a second logic state or a "low" logic signal), P1 will conduct more than P2, causing proportionally more bias current to be drawn by P1 than P2, thus causing the voltage at node OUT− to be pulled closer to the high supply voltage Vdd than the voltage at node OUT+, and insuring that this differential signal is also detected by the remaining receiver circuitry despite the low common-mode voltage.

When a differential signal having a high common-mode voltage (e.g. greater than 1.2V) is received, NFETs N1 and N2 will dominate operation. Accordingly, when a high common-mode differential signal wherein IN+ is greater than IN− is received, N1 will conduct more than N2, causing proportionally more bias current to be drawn by N1 than N2, thus causing the voltage at node OUT− to be pulled closer to the low supply voltage Vss than the voltage at node OUT+, and insuring that the differential signal is detected by the remaining receiver circuitry despite the high common-mode voltage. Conversely, when a high common-mode differential signal wherein IN− is greater than IN+ is received, N2 will conduct more than N1, causing proportionally more bias current to be drawn by N2 than N1, thus causing the voltage at node OUT+ to be pulled closer to the low supply voltage Vss than the voltage at node OUT−, and insuring that this differential signal is also detected by the remaining receiver circuitry despite the high common-mode voltage.

Accordingly, it is seen that by virtue of the transistor pairs having opposite polarity types (i.e. PFETs vs. NFETs), operability is achieved at each extreme of the possible common-mode input voltages. The circuit 302 thus solves some of the common-mode voltage variation problems afflicting the prior art where only one of circuits 304 and 306 is used. However, some problems remain.

For example, the time delay between a differential signal appearing at the input of circuit 302 and the corresponding differential signal appearing at the output of circuit 302 will vary depending on the level of the common-mode voltage. More specifically, since either the PFETs or NFETs will not operate optimally at either extreme of the range of possible common-mode voltages, delay will be greater at these extremes compared to when the common-mode voltage is nearer the midpoint of the possible range, where both sets of transistors will operate at near maximum. Also, the gain of the overall circuit will be less at either extreme compared to the gain of the circuit nearer the midpoint. These differences in gain and time delays across values of common-mode voltage can be problematic because they may cause the resulting differential output signal to be not accurately detectable by remaining circuitry 308. Further, when the common-mode voltage is nearer the midpoint of the possible range, both sets of transistors will be operable, thus drawing bias current from both current sources and consuming more power than when the common-mode voltage is at either extreme.

Figure 5:
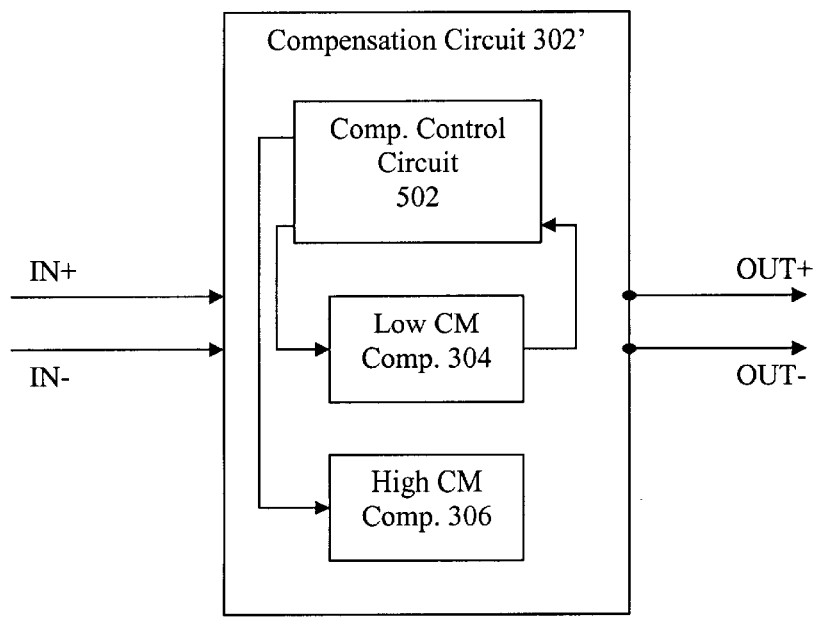
FIG. 5 is a block diagram illustrating another example receiver in accordance with the principles of the invention.

FIG. 5 is a block diagram illustrating another example of a compensation circuit 302' in accordance with the principles of the present invention. As shown in FIG. 5, the compensation circuit 302' in this embodiment further includes a compensation control circuit 502. In general, compensation control circuit 502 senses the operation of one of compensation circuit 304, 306 so as to control the operation of the other of circuits 304, 306 to insure, for example, a more stable operation of circuit 302' over a wide range of common-mode voltages.

Figure 6:
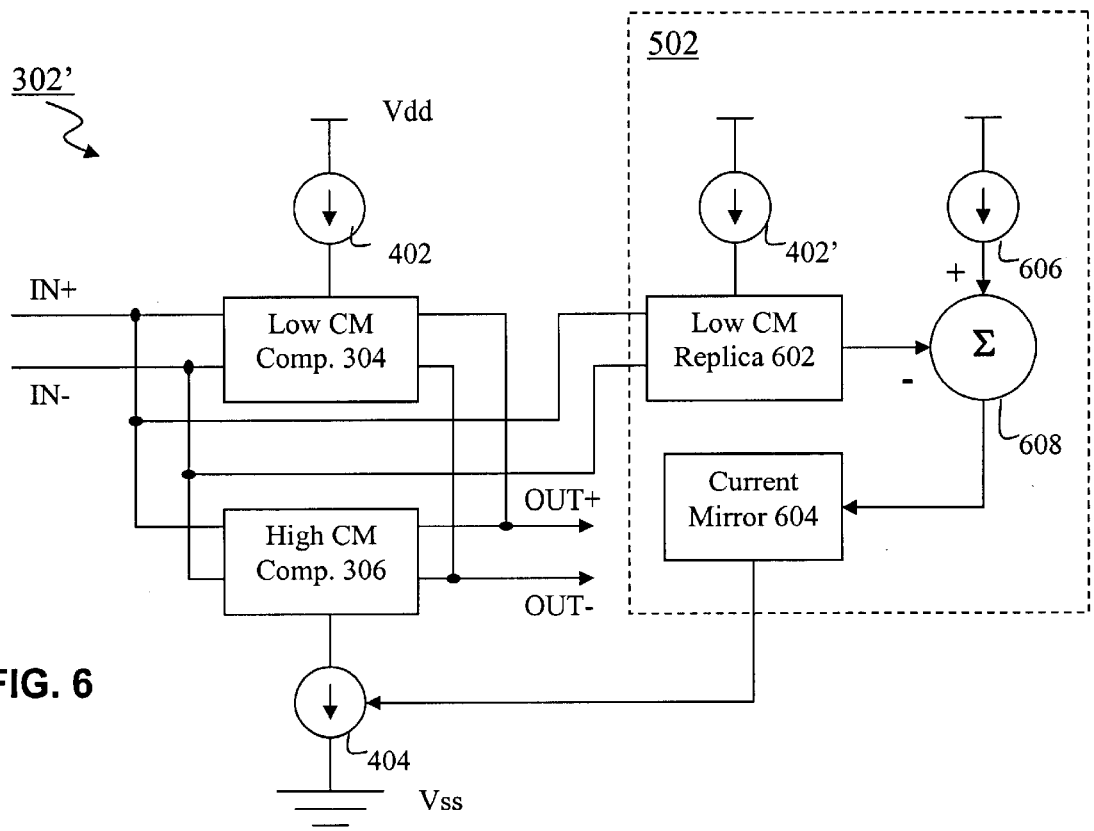
FIG. 6 is a functional block diagram illustrating an example implementation of a compensation and control circuit that can be included in a receiver such as that illustrated in FIG. 5.

FIG. 6 is a functional block diagram illustrating an example of compensation circuit 302' in further detail. As shown in FIG. 6, control circuit 502 includes a low common mode compensation replica circuit 602, a current mirror 604, a current reference source 606 and a current subtractor 608. In general, control circuit 502 senses the operation of compensation circuit 304 by operation of replica circuit 602. An operational characteristic that is sensed in this example is the bias current drawn from bias current supply 402 by the low common mode compensation circuit 304. This sensed current is replicated by circuit 602 and a current from bias current supply 402' corresponding to that drawn from bias current supply 402, is deducted from a reference current 606 by current subtractor 608, which produces a difference current that is supplied to current mirror 604. Current mirror 604 controls the amount of bias current drawn by high common mode compensation circuit 306, either enhancing or restricting the operation of circuit 306 in accordance with the replicated operation of circuit 304.

For example, during nominal common mode voltages (i.e. common-mode voltages around 1.2V in a LVDS example), where the current drawn from bias current supply 402 by circuit 304, and thus a current corresponding thereto drawn from bias current supply 402' by circuit 602, is close to the reference current 606, the bias current drawn from bias current supply 404 by circuit 306 will be boosted by only a minimal amount. On the other hand, during high common mode voltages (i.e. common-mode voltages well above 1.2V), where the current drawn by circuit 304, and thus a corresponding current drawn by circuit 602, is well below the reference current 606, the bias current drawn from bias current supply 404 by circuit 302 will be boosted by a significant amount. In this way, control circuit 502 stabilizes the operation of circuit 302' over a wide range of common mode voltages by aiming to keep the sum operation of circuits 304 and 306 at a constant level.

It should be apparent that control circuit 502 could alternatively control the operation of low CM compensation circuit 304 based on a sensed operation (e.g. the current drawn from bias current supply 404) of high CM compensation circuit 306. Moreover, combined control on combined sensing could be implemented. Those skilled in the art will understand the various possible alternatives and how to implement them after being taught by the present disclosure.

Figure 7:
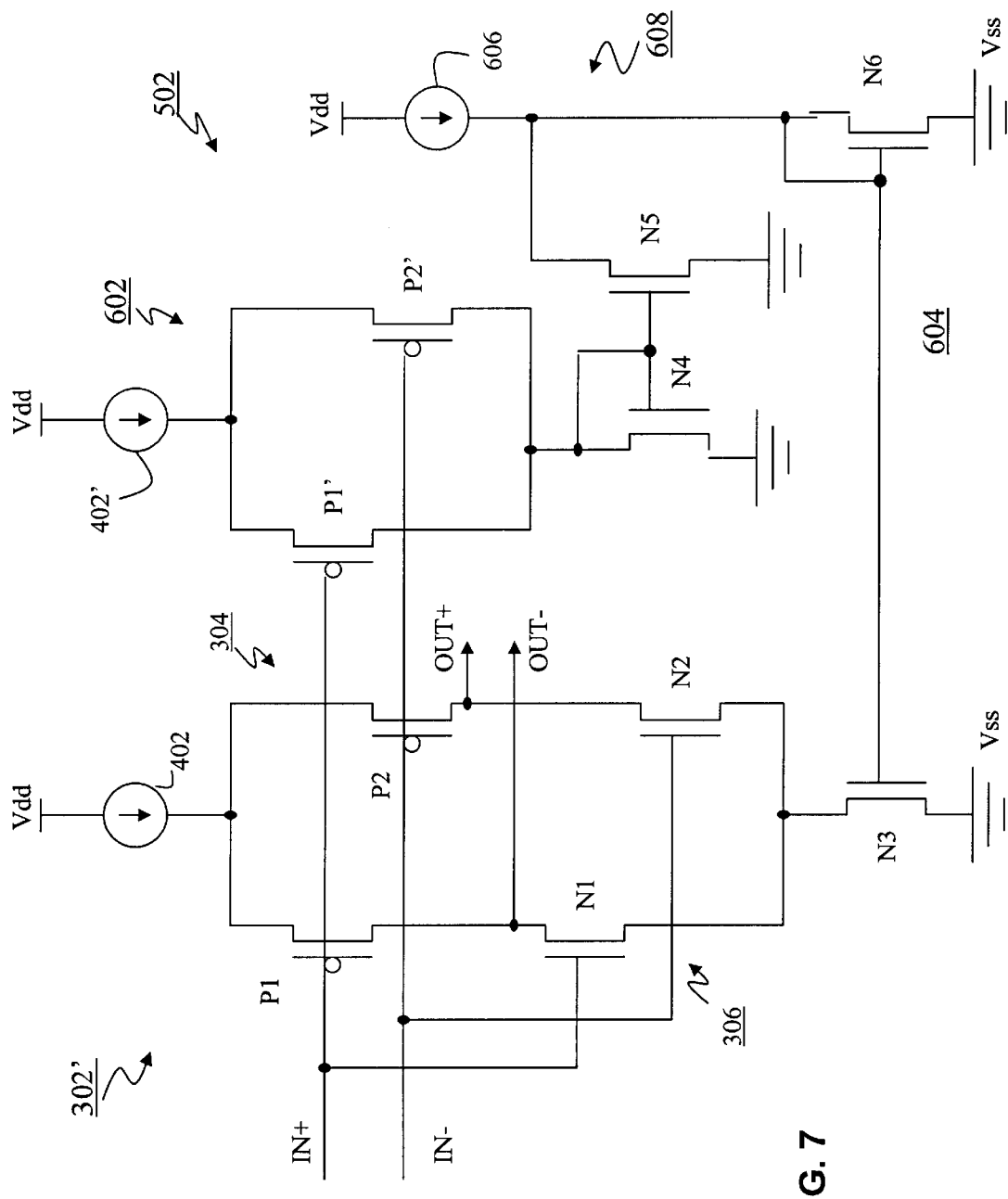
FIG. 7 is a circuit diagram illustrating an example implementation of the compensation and control circuit illustrated in FIG. 6.

FIG. 7 is a circuit diagram illustrating an example implementation of circuit 302'. As shown in FIG. 7, circuit 302' includes, in addition to the components shown and described in connection with FIG. 4, a low common mode replica circuit 602 including PFETs P1' and P2' and current source 402', current reference source 606, current mirror pair N4/N5, and current mirror pair N6/N3. In this example implementation, the two current mirror pairs, by their connection with circuits 602, 606 and 306, together implement corresponding components 604, 608 and 404 in FIG. 6.

In one example implementation of replica circuit 602, P1' has the same dimensions as P1 and P2' has the same dimensions as P2. However, this is not necessary. For example, P1', P2' and 402' can be scaled by a similar scale factor in comparison to the dimensions of P1, P2 and 402, respectively. This scale factor can be accounted for by scaling N3 with respect to N6 by the inverse amount, for example. In particular, if P1' and P2' have width/length ratios that are one-fourth the corresponding values as P1 and P2, respectively, then N3 can have a width/length ratio that is four times the value of N6. This reduces the power consumption of replica circuit 602. It should be apparent that many alternatives are possible. For example, in one CMOS implementation where Vdd is 3.3V, P1 and P2 have width/length ratios of about 45, N1 and N2 have width/length ratios of about 9, P1' and P2' have width/length ratios of about 11.25, N5 has a width/length ratio of about 4, N6 has a width/length ratio of about 15, N3 has a width/length ratio of about 60, and the reference current supplied by 606 is about 300 microamps.

In operation, the differential input signal (on lines IN+ and IN−) is supplied to replica circuit 602 in addition to PFETs P1, P2 and NFETs N1, N2 as in the previous embodiment. Replica circuit 602 duplicates the operation of PFETs P1, P2 in accordance with the common mode voltage of the received differential input signal (and also perhaps in accordance with a scale factor). One characteristic of the operation is the amount of bias current drawn from bias current supply 402 by PFETs P1, P2 by virtue of the level of the common mode voltage. A current corresponding to this sensed current (either the same or scaled by a scale factor) is drawn by PFETs P1' and P2' from current source 402' in the replica circuit 602. NFETs N4/N5 subtract a current corresponding to the amount of the replica circuit current from the current reference 606. The remainder of the reference current is provided to current mirror N6/N3, which controls the operation of high common mode compensation circuit 306 comprised of NFETs N1 and N2.

Accordingly, the more operable PFETs P1' and P2' are (and, correspondingly, the low common mode compensation circuit 304 due to the low level of the common mode voltage), the more current is drawn from the current reference 606 by current mirror N4/N5, and the less current is available to current mirror N6/N3 (and hence the less bias is given to the operation of high common mode compensation circuit 306). Conversely, the less operable PFETs P1' and P2' are (and, correspondingly, the low common mode compensation circuit 304 due to the high level of the common mode voltage), the less current is drawn from the current reference 606 by current mirror pair N4/N5, and the more current is available to current mirror N6/N3 (and hence the more bias is given to the operation of high common mode compensation circuit 306). The components of control circuit 502 in FIG. 7 thus act to keep the combined operations of circuits 304 and 306 stable over a wide range of common mode voltages.

Although the present invention has been described hereinabove with reference to an example implementation in LVDS applications, the invention is not limited to such applications and can be useful for other proprietary and non-standard differential signaling applications, whether considered "low voltage" or not.

Further, although the present invention has been particularly described with reference to the preferred embodiments thereof, it should be readily apparent to those of ordinary skill in the art that changes and modifications in the form and details may be made without departing from the spirit and scope of the invention. It is intended that the appended claims include such changes and modifications.

What is claimed is:

1. A differential signaling apparatus, comprising:
    a pair of input nodes that receive a differential signal having an input common mode voltage;
    a pair of output nodes;
    a first compensation circuit coupled to the input nodes and the output nodes, the first compensation circuit being operative to establish a first component of a differential voltage across the pair of output nodes in response to the received differential signal;
    a second compensation circuit coupled to the input nodes and the output nodes, the second compensation circuit being operative to establish a second component of the differential voltage across the pair of output nodes in response to the received differential signal; and
    a control circuit that senses an operational characteristic of the first compensation circuit and controls operation of the second compensation circuit in accordance with the sensed operational characteristic,
    wherein the first compensation circuit is more operative at a first level of the input common mode voltage than at a second level of the input common mode voltage,
    and wherein the second compensation circuit is more operative at the second level of the input common mode voltage than at the first level of the input common mode voltage.

2. A differential signaling apparatus according to claim 1, wherein the control circuit includes a replica circuit that provides an output corresponding to the sensed operational characteristic by replicating operation of the first compensation circuit.

3. A differential signaling apparatus according to claim 2, wherein the sensed operational characteristic is a bias current, the control circuit further including:

a reference current supply that produces a reference current;

a current subtractor that provides a difference current between the reference current and a current corresponding to the bias current; and a current mirror that controls an operating current of the second compensation circuit in accordance with the difference current.

4. A differential signaling apparatus according to claim 3, wherein the control circuit and the first compensation circuit are operative such that the difference current is greater at the second level of the input common mode voltage than at the first level of the input common mode voltage.

5. A differential signaling apparatus according to claim 1, wherein the first compensation circuit includes a first pair of transistors each having a gate and a pair of source/drain terminals, the gates of the first transistors being respectively coupled to the pair of input nodes, one of the source/drain terminals of each transistor being commonly coupled to a first current supply, the other of the source/drain terminals of the first transistors being respectively coupled to the pair of output nodes.

6. A differential signaling apparatus according to claim 5, wherein the second compensation circuit includes a second pair of transistors each having a gate and a pair of source/drain terminals, the gates of the second transistors being respectively coupled to the pair of input nodes, one of the source/drain terminals of each transistor being commonly coupled to a second current supply, the other of the source/drain terminals of the second transistors being respectively coupled to the pair of output nodes.

7. A differential signaling apparatus according to claim 6, wherein the second pair of transistors has a second polarity type opposite from a first polarity type of the first pair of transistors.

8. A differential signaling apparatus according to claim 5, wherein the control circuit senses an amount of current drawn from the first current supply by the first compensation circuit and controls operation of the second compensation circuit in accordance with the sensed amount of current.

9. A differential signaling apparatus according to claim 8, wherein the control circuit includes a replica circuit of the first compensation circuit that provides an output corresponding to the sensed current by replicating operation of the first compensation circuit.

10. A differential signaling apparatus according to claim 8, wherein the control circuit includes a replica circuit of the first compensation circuit including a third pair of transistors each having a gate and a pair of source/drain terminals, the gates of the third transistors being respectively coupled to the pair of input nodes, one of the source/drain terminals of each transistor being commonly coupled to a third current supply, the other of the source/drain terminals of the third transistors being commonly coupled to a current sensing node.

11. A differential signaling apparatus according to claim 10, wherein the third pair of transistors are substantially similar to the first pair of transistors.

12. A differential signaling apparatus according to claim 10, wherein the third pair of transistors are scaled in proportion to the first pair of transistors.

13. A differential signaling apparatus according to claim 10, wherein the control circuit further includes:

a reference current supply that produces a reference current;

a current subtractor that provides a difference current between the reference current and a current corresponding to the sensed current in the replica circuit; and a current mirror that controls an operating current of the second compensation circuit in accordance with the difference current.

14. A differential signaling apparatus according to claim 13, wherein the control circuit and the first compensation circuit are operative such that the difference current is greater at the second level of the input common mode voltage than at the first level of the input common mode voltage.

15. A differential signaling apparatus, comprising:

a pair of input nodes that receive a differential signal having an input common mode voltage;

a pair of output nodes;

a first compensation circuit coupled to the input nodes and the output nodes, the first compensation circuit being operative to establish a first component of a differential voltage across the pair of output nodes in response to the received differential signal;

a second compensation circuit coupled to the input nodes and the output nodes, the second compensation circuit being operative to establish a second component of the differential voltage across the pair of output nodes in response to the received differential signal; and a control circuit coupled to the first and second compensation circuits;

wherein the first compensation circuit is more operative at a first level of the input common mode voltage than at a second level of the input common mode voltage, and wherein the second compensation circuit is more operative at the second level of the input common mode voltage than at the first level of the input common mode voltage, and wherein the control circuits adjusts the operation of the second compensation circuit at the first and second levels of the input common mode voltage in correspondence with the operation of the first compensation circuit so that a combined operation of the first and second compensation circuits is substantially the same at the first and second levels of the input common mode voltage.

16. A differential signaling apparatus, comprising:

means for receiving a differential signal having an input common mode voltage;

output means;

first means for compensating for a low level of the input common mode voltage, the first means establishing a first component of a differential voltage at the output means in response to the received differential signal;

second means for compensating for a high level of the input common mode voltage, the second means for establishing a second component of the differential voltage at the output means in response to the received differential signal;

means for sensing an operational characteristic of the first means; and means for controlling operation of the second means in accordance with the sensed operational characteristic, wherein the first means is more operative at the low level of the input common mode voltage than at the high level of the input common mode voltage, and wherein the second means is more operative at the high level of the input common mode voltage than at the low level of the input common mode voltage.

17. A differential signaling apparatus according to claim 16, wherein the controlling means is operative such that a combined operation of the first and second means is substantially the same at an entire range including the low and high levels of the input common mode voltage.

18. A differential signaling method, comprising:

receiving a differential signal having an input common mode voltage;

firstly compensating for a low level of the input common mode voltage, the firstly compensating step including establishing a first component of a differential voltage in response to the received differential signal in accordance with a first operational characteristic;

secondly compensating for a high level of the input common mode voltage, the secondly compensating step including establishing a second component of the differential voltage in response to the received differential signal in accordance with a second operational characteristic;

sensing the first operational characteristic; and controlling the second operational characteristic in accordance with the sensed first operational characteristic, wherein the first operational characteristic is stronger at the low level of the input common mode voltage than at the high level of the input common mode voltage, and wherein the second operational characteristic is stronger at the high level of the input common mode voltage than at the low level of the input common mode voltage.

19. A differential signaling method according to claim 18, wherein the controlling step is operative such that a combination of the first and second operational characteristics is substantially the same across an entire range including the low and high levels of the input common mode voltage.

* * * * *